United States Patent [19]

Matsuki

[11] Patent Number: 4,853,756
[45] Date of Patent: Aug. 1, 1989

[54] PROJECTION EXPOSURE APPARATUS

[75] Inventor: Toshio Matsuki, Tokyo, Japan

[73] Assignee: Canon Kabushiki Kaisha, Tokyo, Japan

[21] Appl. No.: 147,796

[22] Filed: Jan. 25, 1988

[30] Foreign Application Priority Data

Jan. 28, 1987 [JP] Japan .................................. 62-15999

[51] Int. Cl.4 ............................................ G03B 27/72
[52] U.S. Cl. ......................................... 355/71; 355/53
[58] Field of Search .............................. 355/53, 71, 67

[56] References Cited

U.S. PATENT DOCUMENTS 4,351,608  9/1982  Coote et al. ........................... 355/71
4,653,903  3/1987  Torigoe et al. ........................ 355/53
4,789,222  12/1988  Ota et al. .

*Primary Examiner*—Monroe H. Hayes
*Attorney, Agent, or Firm*—Fitzpatrick, Cella, Harper & Scinto

[57] ABSTRACT

A projection exposure apparatus includes a projection lens system for projecting a pattern of an original upon a workpiece, an illumination optical system for illuminating the original with a light having a predetermined central wavelength, and a bandwidth changing arrangement effective to change the bandwidth of the light irradiating the original.

8 Claims, 3 Drawing Sheets

PROJECTION EXPOSURE APPARATUS

FIELD OF THE INVENTION AND RELATED ART

This invention relates to a projection exposure apparatus and, more particularly, to a projection exposure apparatus called a "stepper" having a projection lens system by which a circuit pattern of a reticle or otherwise is projected upon a wafer.

The degree of integration of devices such as semiconductor microcircuits which are to be manufactured by use of exposure apparatuses has been rapidly increased. For example, at present, one-megabit memory devices can be manufactured practicably. Also, it is expected that four-megabit memory devices will be practicably manufactured in the near future. To meet such high-degree integration, exposure apparatuses for use in the manufacture of microcircuits should have high performance. As an example, the apparatus should have superior alignment capability for precisely superimposing different patterns in plural pattern printing processes. Also, it should have a superior processing capability that allows execution of the wafer printing procedure with high throughput. Further, the apparatus should have excellent resolution that permits printing of fine patterns having a linewidth not greater than 0.8 micron.

While various types of exposure apparatuses have been developed, step-and-repeat type projection exposure apparatuses called "steppers" are prevalently used. The projection exposure apparatus includes a projection lens system having been corrected, precisely, for various optical aberrations in order to assure improved pattern transfer or printing performance. However, it is not difficult to completely avoid the optical aberrations, particularly the chromatic aberration.

For diminishing the effect of the chromatic aberration, it is a very effective means to narrow the bandwidth of the wavelength of the light used for the pattern printing. U.S. patent application Ser. No. 813,226 assigned to the same assignee of the subject application has proposed use of a multilayered interference thin film filter for narrowing the wavelength range of the light used for the printing.

The currently available steppers prevalently use, as for the photoprinting light, g-line rays having a wavelength (central wavelength) 436 nm. The light of g-line has a bandwidth which is, as shown in FIG. 2, 10 nm (half width) at the peak 436 nm. Recently, however, when the light of g-line is used for the photoprinting, its bandwidth is narrowed in some cases by a suitable means to an order of 5 nm (half width) such as shown in FIG. 3. The bandwidth narrowing is made to diminish the effect of the chromatic aberration of the projection optical system, thereby to assure high resolution performance.

However, the bandwidth narrowing is not always advantageous. Namely, for the light having the same peak intensity (see FIG. 4), the band narrowing results in cutting or intercepting such quantity of light as corresponding to the hatched area in FIG. 4. This innevitably causes substantial reduction in the quantity of light that can be used for the photoprinting. This leads to a problem that, in a case where a pattern having a relatively wide line-width is going to be photoprinted in some of various printing procedures for the manufacture of the same microcircuit, the printing of such relatively wide line-width pattern has to be executed with an insufficient quantity of light.

SUMMARY OF THE INVENTION

It is accordingly a primary object of the present invention to provide a projection exposure apparatus which constantly ensures optimum projection exposure suited to the characteristics of a pattern, to be photoprinted, such as the linewidth, for example.

In accordance with one aspect of the present invention, to achieve the above object, there is provided a projection exposure apparatus which includes a projection lens system for projecting a pattern of an original upon a workpiece, an illumination optical system for illuminating the original with a light having a predetermined central wavelength, and a bandwidth changing arrangement effective to change the bandwidth of the light irradiating the original.

In accordance with one preferred form of the present invention which will be described later, an illumination optical system of a projection exposure apparatus has a plurality of optical elements having different bandpass characteristics. These optical elements are selectively and retractively inserted into a path of the light from a light source such as an Hg lamp or otherwise.

Namely, the optical elements are interchangeably used in the illumination optical system so as to change the bandwidth of the light used for the photoprinting. This allows that, for the printing of such a pattern having a relatively wide linewidth, the printing is carried out with a large quantity of light having a relatively broad bandwidth. Thus, high throughput is ensured. On the other hand, for the printing of such a pattern having a narrow linewidth, light having a very narrow bandwidth is used to thereby minimize the effect of the chromatic aberration of the projection lens system. Thus, high-resolution printing is attainable. In this manner, the wafer processing capability and the resolution characteristics of the exposure apparatus are made adjustable as desired.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
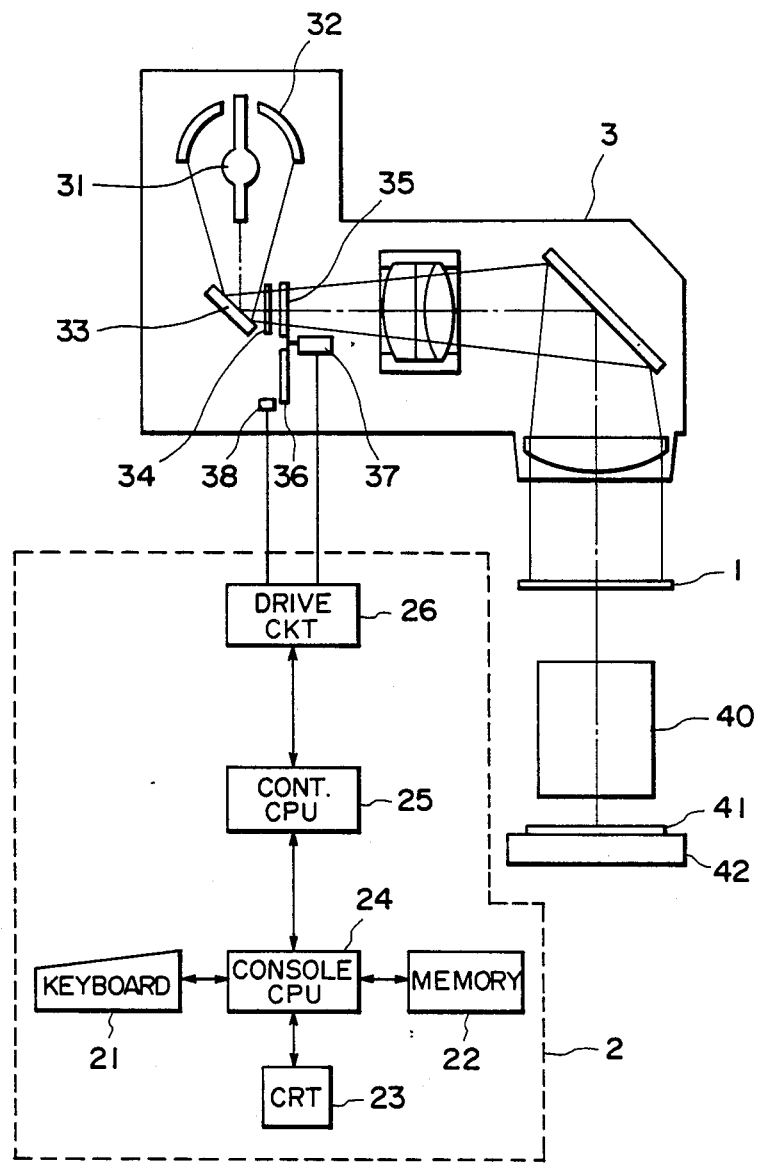
FIG. 1 is a schematic and diagrammatic view of a projection exposure apparatus according to one embodiment of the present invention.

Referring first to FIG. 1, there is shown a projection exposure apparatus according to one embodiment of the present invention, which apparatus includes an illumination optical system and a control system.

Denoted at 1 in FIG. 1 is a photomask having a circuit pattern formed thereon. Denoted generally at 3 is an illumination optical system which includes at least two different bandpass filters and a filter changing arrangement. Also, denoted generally at 2 is a control system for controlling the changing of the filters.

Light emitted from an Hg lamp 31 included in the illumination optical system 3 is corrected by a parabolic mirror 32 and then is deflected by a reflection mirror 33. The light from the mirror 33 passes through a sharp-cut filter 34 which is effective to cut the wavelengths in the "heat wave" region. Subsequently, the light passes through a bandpass filter 35, whereby the bandwidth of the light to be used for the photoprinting is determined. After passing the filter 35, the light is directed by a condenser lens and a reflection mirror to the photomask 1 (which may of course be a reticle), thereby to irradiate the same as the "photoprinting light".

Denoted at 40 in FIG. 1 is a projection lens system which comprises a plurality of lens elements. The projection lens system 40 has been corrected for the various optical aberrations, with reference to a particular design wavelength (central wavelength) which is that of the g-line light in this embodiment. The projection lens system has an imaging magnification in a range of 1/5 to 1/10.

Denoted at 41 is a wafer having a surface which is coated with a suitable resist material. The wafer 41 is placed on a wafer stage 42 which is movable in suitable directions.

The circuit pattern of the photomask 1 as illuminated by the light from the illumination optical system 3 is projected by the projection lens system 40 upon the wafer 41 in a reduced scale. By this, the circuit pattern of the photomask 1 is transferred onto or photoprinted on the wafer 41.

Figure 2:
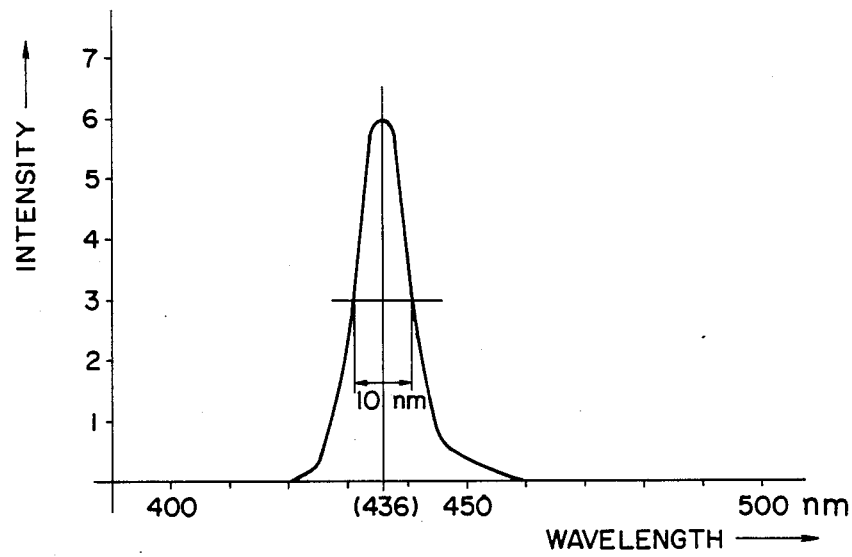
FIGS. 2 and 3 are graphs, respectively, showing the spectral characteristics of a g-line light having a half width 10 nm and a g-line light having a half width 5 nm.
Figure 3:
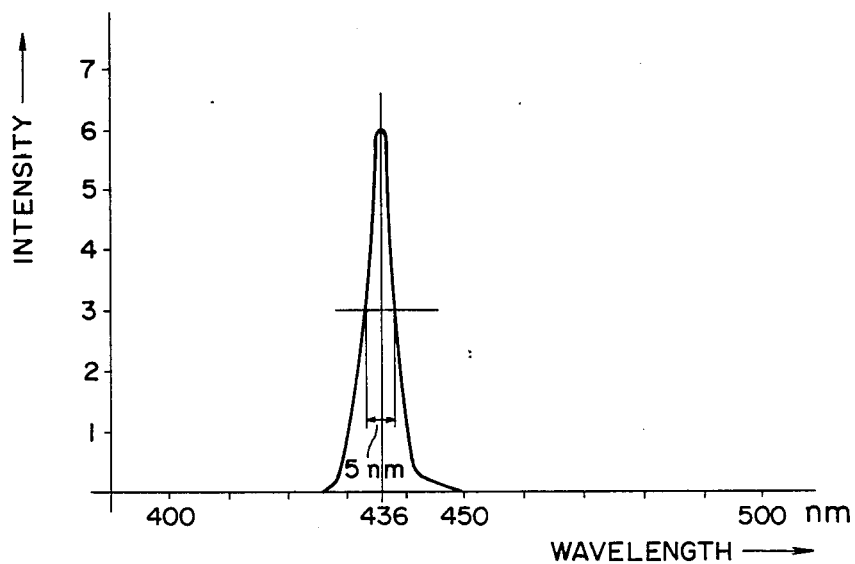
Figure 4:
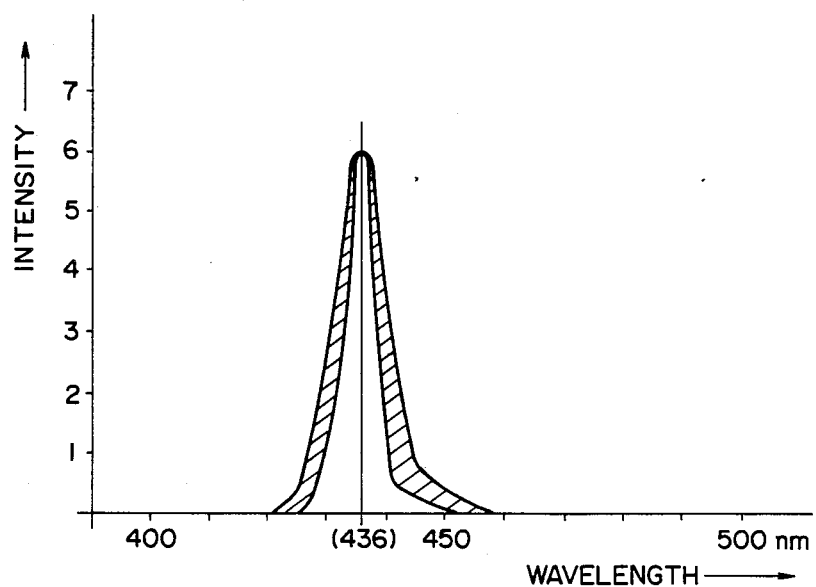
FIG. 4 is a graph schematically showing the difference in the quantity, for the light shown in FIG. 2 and the light shown in FIG. 3.

The light emitted from the lamp 31 contains plural line spectrums such as g-line, h-line (405 nm), e-line (546 nm) and otherwise. In the projection exposure apparatus of the present embodiment, the sharp-cut filter 34 and the bandpass filter 35 (or 36) are used for the wavelength selection, such that light of a single line spectrum having a central wavelength corresponding to that of the g-line, is extracted. Further, the extracted g-line light has a bandwidth which is determined by the bandpass characteristics of the bandpass filter 35 or 36. In the present embodiment, the bandpass filters 35 and 36 have been designed so that the light passed through the bandpass filter 35 (hereinafter such light will be referred to also as a "first photoprinting light") has the spectral characteristics such as shown in FIG. 2 while, on the other hand, the light passed through the bandpass filter 36 (hereinafter such light will be referred to also as a "second photoprinting light") has the spectral characteristics such as shown in FIG. 3.

Each of the bandpass filters 35 and 36 may be provided by a multi-layered interference thin film filter such as disclosed in the aforementioned U.S. patent application Ser. No. 813,226 or it may be formed by a wavelength selecting element such as an etalon or otherwise.

In the projection exposure apparatus of the present embodiment, the bandpass filter 35 is used for the photoprinting of such a pattern having a relatively wide linewidth. On the other hand, the bandpass filter 36 is used for the photoprinting of such a pattern having a narrow linewidth. Accordingly, for the photoprinting of a pattern having a relatively large linewidth (e.g. 1.5–2.0 microns), the throughput of the exposure apparatus can be increased (e.g. 1.5–2 times higher). On the other hand, for the photoprinting of a pattern having a small linewidth (e.g. 0.7–0.8 micron), the effect of the chromatic aberration of the projection lens system 41 can be minimized sufficiently. It will be understood that the bandpass filters 35 and 36 are interchanged in accordance with the photomask 1 used (namely, the linewidth of the circuit pattern).

The bandpass filters 35 and 36 are fixedly mounted to a common support member which is coupled to a rotational shaft of an actuator 37. By rotating the support member, the bandpass filters 35 and 36 are interchanged.

Description will now be made of the sequence for changing the bandwidth of the photoprinting light having a particular central wavelength.

First, for the selection of a suitable bandwidth in accordance with the kind or type of a photomask 1 to be used, an operator designates, by typing an input keyboard 21 of the control system 2, a particular bandwidth to be selected or a particular filter having bandpass characteristics corresponding to the bandwidth to be selected. The information concerning the bandwidth to be used is stored into a memory 22 by way of a console CPU (central processing unit) 24. At the same time, such information is displayed on a CRT (cathode ray tube) 23. Subsequently, the information concerning the bandwidth stored in the memory 22 is transmitted to a control CPU 25, wherein the information signal is converted into an instruction voltage corresponding to the selected bandwidth. The instruction voltage is applied to a driving circuit 26, such that the actuator 37 is driven to replace a bandpass filter (e.g. 35) positioned in the path of the light from the lap 31 by another bandpass filter (e.g. 36). The actuator 37 may comprise a DC motor, a pulse motor, an air cylinder or otherwise.

Position detecting sensor 38 is provided to detect the position of the extracted bandpass filter (which is the filter 35 in this case) and, therefore, the position of the newly introduced bandpass filter (which is the filter 36 in this example). When the selected bandpass filter is placed at a correct position and if this is confirmed by the sensor 38, the bandwidth changing operation is completed.

In the manner described above, the bandpass filters 35 and 36 provided in the illumination optical system can be selected as desired.

In the present embodiment, as has hitherto been described, the bandpass filters 35 and 36 are selected as desired to thereby change the bandwidth of the photoprinting light having a central wavelength equal to that of the g-line. However, the bandwidth changing (i.e. changing the wavelength range) is attainable also by controlling a continuous spectrum which exists about the line spectrum such as the g-line. In such case, the bandpass filters 35 and 36 may be designed and manufactured so that the bandpass filter 35 is effective to extract a particular line spectrum together with a continuous spectrum adjacent to the particular line spectrum while the bandpass filter 36 is effective to cut the continuous spectrum with the result that only the particular line spectrum is extracted. Details of the relation between the line spectrum and the continuous spectrum are disclosed in the aforementioned U.S. patent application Ser. No. 813,226.

Each of the bandpass filters 35 and 36, when it is introduced, is preferably disposed at such position at which the light from the light source such as the lamp 31 advances as a parallel light (i.e. the position at which the chief ray advances in parallel to the optical axis of the illumination optical system). With this arrangement, the wavelength selecting characteristics of the filter can function correctly, for the light from the light source.

While in the present embodiment two bandpass filters are used as the wavelength variably-selecting optical means which is effective to change the bandwidth, such optical means may comprise a combination of a sharp-cut filter and an interference filter (such as an etalon or otherwise) or a bandpass filter formed by a multilayered interference thin film. In a case where the wavelength selecting optical means is provided by a combination of a sharp-cut filter and an interference filter or two or more bandpass filters, the bandwidth may of course be changed by changing one or more filters or by changing the combination of these filters.

The present invention is effectively applicable also to a projection exposure apparatus having a laser such as an excimer laser as the light source. Namely, the bandwidth (wavelength range) of the laser beam can be variably narrowed, as desired, by interchanging different wavelength selecting elements such as etalons, diffraction gratings or otherwise having different band-narrowing characteristics.

In accordance with the present invention, as has hitherto been described, the printing of a pattern having a relatively large linewidth can be executed with a large quantity of light, thus ensuring high throughput. On the other hand, for the printing of a pattern having a minute line width, the effect of the chromatic aberration of a projection lens system can be minimized with the result that high-resolution pattern printing is attainable. Therefore, the exposure apparatus can be operated in a most suitable and efficient manner, which is best suited to the characteristics of the pattern to be printed and to the desire of the operator who handles the apparatus.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus selectively usable with first and second originals having patterns of different line-widths, said apparatus comprising:
   an illumination system providing light having a central wavelength;
   a projection lens system cooperable with said illumination system for projecting a pattern upon a workpiece; and
   a bandwidth selector operable, when the first and second originals as selectively used are irradiated with the light from said illumination system, to change the bandwidth of the light such that the first and second originals are irradiated with light of different bandwidths, but of substantially the same central wavelength.

2. An apparatus according to claim 1, wherein the line-width of the pattern of the first original is greater than the line-width of the pattern of the second original, wherein said bandwidth selector includes first and second bandpass filters having different bandpass characteristics such that said first bandpass filter has a greater passband than said second bandpass filter, said first and second bandpass filters being detachably mountable into a path of the light from a light source of said illumination system, and wherein said bandwidth selector further includes means for selectively introducing one of said first and second bandpass filters into said path, such that said first bandpass filter is introduced into said path when the first original is used and said second bandpass filter is introduced into said path when the second original is used.

3. A projection exposure apparatus selectively usable with first and second originals having patterns of different line-widths, said apparatus comprising:
   an illumination system providing first and second lights having a common central wavelength but having different bandwidths;
   a projection lens system cooperable with said illumination system for projecting a pattern upon a workpiece; and
   means for adjusting said illumination system so the first original is irradiated with the first light and the second original is irradiated with the second light.

4. An apparatus according to claim 3, wherein said illumination system includes a light source, filtering means disposed in a path of the light from said light source and optical means effective to direct the light passed through said filtering means to the original, and wherein said filtering mans has a variable bandpass characteristic sc that, by changing the bandpass characteristic of said filtering means, said first and second lights are selectively supplied.

5. An apparatus according to claim 4, wherein said filtering means includes first and second filter elements having different bandpass characteristics, said first and second filter elements being selectively introduced into said path to thereby change the bandpass characteristic of said filtering means.

6. An apparatus according to claim 4, wherein said filtering means includes a plurality of filter elements having different wavelength selecting characteristics, said filter elements being selectively introduced in a variable combination into said path to thereby change the bandpass characteristic of said filtering means.

7. An apparatus according to claim 3, wherein said illumination system includes a light source which comprises an excimer laser.

8. A projection expsoure apparatus usable with a first and second mask pattern having different line-widths, said apparatus comprising:
   an illumination system for providing light along a path;
   a movable stage for carrying a wafer threon;
   a reduction projection lens system, cooperable with said illumination system and said movable stage, for projecting a pattern upon the wafer;
   filter selector means for selectively introducing first and second filters into said path, said first and second filters providing lights of common center wavelength but of different bandwidths; and
   means for positioning said filter selector means into said path as the first mask pattern is to be projected upon the wafer by said lens system, and for projecting said second filter into said path as the second mask pattern is to be projected upon the wafer by said lens system.

* * * * *

UNITED STATES PATENT AND TRADEMARK OFFICE
CERTIFICATE OF CORRECTION

PATENT NO. : 4,853,756

DATED : August 1, 1989

INVENTOR(S) : Toshio Matsuki

It is certified that error appears in the above-identified patent and that said Letters Patent is hereby corrected as shown below:

COLUMN 1:

Line 62, "innevitably" shoud read --inevitably--.

COLUMN 4:

Line 31, "lap 31" should read --lamp 31--.

Line 49, "(i.g." should read --(e.g.--.

UNITED STATES PATENT AND TRADEMARK OFFICE
CERTIFICATE OF CORRECTION

PATENT NO. : 4,853,756

DATED : August 1, 1989

INVENTOR(S) : Toshio Matsuki

It is certified that error appears in the above-identified patent and that said Letters Patent is hereby corrected as shown below:

COLUMN 6:

Line 26, "filtering mans" should read --filtering means--.

Line 27, "sc" should read --so--.

Line 45, "expsoure" should read --exposure--.

Line 50, "threon;" should read --thereon;--.

Line 58, "said filter selector means" should read --first filter--.

Signed and Sealed this

Twenty-fifth Day of September, 1990

*Attest:*

HARRY F. MANBECK, JR.

*Attesting Officer*      *Commissioner of Patents and Trademarks*